United States Patent
Sugimoto

[11] Patent Number: 5,933,522
[45] Date of Patent: Aug. 3, 1999

[54] SPECIFIC PART SEARCHING METHOD AND DEVICE FOR MEMORY LSI

[75] Inventor: Masaaki Sugimoto, Tokyo, Japan

[73] Assignee: NEC Corporation, Tokyo, Japan

[21] Appl. No.: 08/915,326

[22] Filed: Aug. 20, 1997

[30] Foreign Application Priority Data

Sep. 11, 1996 [JP] Japan .................................. 8-240348

[51] Int. Cl.⁶ ..................................................... G06K 9/00
[52] U.S. Cl. ............................................................ 382/149
[58] Field of Search ..................................... 382/145, 149, 382/141, 193, 194, 192; 371/21.2, 21.4; 365/200, 201; 324/765

[56] References Cited

U.S. PATENT DOCUMENTS 5,506,555  4/1996  Hoshino .................................. 333/261

FOREIGN PATENT DOCUMENTS 3174738  1/1991  Japan .
6-181244  6/1994  Japan .

Primary Examiner—Joseph Mancuso
Assistant Examiner—Vikkram Bali
Attorney, Agent, or Firm—Sughrue, Mion, Zinn, Macpeak & Seas, PLLC

[57] ABSTRACT

An object of the present invention is to provide a device for and a method of searching a really defective cell by removing influence of poor accuracy of a stage shifting mechanism or a numerical operation error of the device. The method of the present invention is a method of searching a specific cell of memory LSI, said method being employed in performing analysis, processing and observation operation with reference to a part of a physical address which corresponds to a logical address outputted as a result of an electrical test performed on memory LSI of array structure in which a plurality of memory cells are repeatedly arranged. Further, position coordinates are continuously observed with reference to an area including the end point of the array structure of said memory cell, the memory cells and a part between the memory cells; the number of memory cells on memory cell LSI is counted according to changes in brightness or luminosity; and a part in which said counted value and the value shown by said physical address coincide with each other is selected as the part of said logical address.

4 Claims, 11 Drawing Sheets

| CLASSIFICATION BY TYPE OF DEFECTS | CONTENTS OF DEFECTS | ID |
|---|---|---|
| DEFECTIVE TERMINAL-OPEN | DEFECTIVE ELECTRIC CONDUCTION WITH MEMORY LSI TERMINAL | 90 |
| DEFECTIVE WHOLE AREA | DEFECTIVE WHOLE CELL AREA | 80 |
| DEFECTIVE LARGE BLOCK | WHOLE AREA INSIDE LARGE CELL BLOCK (CELL BLOCK INCLUDING A PLURALITY OF CELL BLOCKS) IS DEFECTIVE | 60 |
| | DEFECTIVE BITS IN LARGE EXTENT, BUT TOTAL STATE IS LESS DEFECTIVE THAN DEFECTIVE WHOLE AREA | 61 |
| DEFECTIVE WORD LINE | SIGNAL WORD LINE IS DEFECTIVE | 40 |
| | 2 OR MORE WORD LINES, SUCCESSIVELY DEFECTIVE | 41 |
| | 2 OR MORE WORD LINES, INTERMITTENTLY DEFECTIVE | 42 |
| | 2 OR MORE DEFECTIVE WORD LINES WITH COMMON DRIVE CIRCUIT | 43 |
| | DEFECTIVE WORD LINE REPRESENTED BY PARALLEL, LARGE EXTENT DEFECTIVE BITS | 44 |
| DIGIT LINE (MAY BE CALLED AS BIT LINE) | SINGLE DIGIT LINE IS DEFECTIVE | 30 |
| | 2 OR MORE DIGIT LINES, SUCCESSIVELY DEFECTIVE | 31 |
| | 2 OR MORE DIGIT LINES, INTERMITTENTLY DEFECTIVE | 32 |
| | 2 OR MORE DEFECTIVE DIGIT LINES WITH COMMON DRIVE CIRCUIT | 33 |
| | LARGE EXTENT DEFECTIVE BITS PARALLEL TO DIGIT LINE | 34 |
| DEFECTIVE CROSS POINT (MAY BE CALLED AS DEFECTIVE CROSS) | A COMBINATION OF DEFECTIVE DIGIT LINE AND A DEFECTIVE WORD LINE | 50 |
| DEFECTIVE MINIMUM BLOCK | WHOLE AREA INSIDE MINIMUM CELL BLOCK IS DEFECTIVE | 62 |
| | DEFECTIVE BITS IN LARGE EXTENT, BUT TOTAL STATE IS LESS DEFECTIVE THAN DEFECTIVE WHOLE AREA | 63 |

FIG. 4A

| | | |
|---|---|---|
| DEFECTIVE 2 BITS (IN CASE ANALYSIS OF DEFECTIVE 2 BITS IS PERFORMED FROM UPPER LEFT TO LOWER RIGHT) | DEFECTIVE 2 BIT PAIR IN CLOSE POINT | 20 |
| | DEFECTIVE 2 BIT PAIR INCLUDING A LOWER RIGHT CELL OF THE NOTICED DEFECTIVE CELL | 20.01 |
| | DEFECTIVE 2 BIT PAIR INCLUDING A LOWER LEFT CELL OF THE NOTICED DEFECTIVE CELL | 20.02 |
| | DEFECTIVE 2 BIT PAIR INCLUDING A LOWER CELL OF THE NOTICED DEFECTIVE CELL | 20.03 |
| | DEFECTIVE 2 BIT PAIR INCLUDING A RIGHT CELL OF THE NOTICED DEFECTIVE CELL | 20.04 |
| | DEFECTIVE 2 BIT PAIR INCLUDING A RIGHT CELL PLURAL-BITS-SPACED FROM THE NOTICED DEFECTIVE CELL | 20.05 |
| | DEFECTIVE 2 BIT PAIR INCLUDING A LOWER CELL PLURAL-BITS-SPACED FROM THE NOTICED DEFECTIVE CELL | 20.06 |
| | DEFECTIVE 2 BIT PAIR WITH COMMON CIRCUIT OR WIRING | 21 |
| DEFECTIVE 1 BIT | SINGLE DEFECT OF 1 BIT | 10 |
| OTHER DEFECTS (MAY BE CALLED AS ELSE DEFECTS) | OBLIQUE DEFECT WITH EQUAL ROW ADDRESS AND EQUAL COLUMN ADDRESS | 70 |
| DEFECTIVE BIT GROUP | DEFECTIVE 3 OR MORE BITS INCLUDED IN A LATTICE OF THE LEVEL SAME AS THAT OF AN ALLOWABLE POSITIONAL ERROR OF ANALYSIS, PROCESSING AND OBSERVATION DEVICE | 65 |

FIG. 4B

| CLASSIFICATION BY TYPE OF DEFECTS | CONTENTS OF DEFECTS | SUBSTITUTION OF POSITION, DIMENSION | ID |
|---|---|---|---|
| DEFECTIVE TERMINAL-OPEN | DEFECTIVE ELECTRIC CONDUCTION WITH MEMORY LSI TERMINAL | TERMINAL OF SAID MEMORY LSI | 90 |
| DEFECTIVE WHOLE AREA | DEFECTIVE WHOLE CELL AREA | CIRCUIT WHICH DRIVES THE WHOLE CIRCUIT | 80 |
| DEFECTIVE LARGE BLOCK | WHOLE AREA INSIDE LARGE CELL BLOCK (CELL BLOCK INCLUDING A PLURALITY OF CELL BLOCKS) IS DEFECTIVE | CIRCUIT WHICH DRIVES A LARGE CELL BLOCK | 60 |
| | DEFECTIVE BITS IN LARGE EXTENT, BUT TOTAL STATE IS LESS DEFECTIVE THAN DEFECTIVE WHOLE AREA | CIRCUIT WHICH DRIVES A LARGE CELL BLOCK | 61 |
| DEFECTIVE WORD LINE | SINGLE WORD LINE IS DEFECTIVE | A SUM OF SAID WORD LINE AND SAID WORD LINE DRIVE CIRCUIT | 40 |
| | 2 OR MORE WORD LINES, SUCCESSIVELY DEFECTIVE | A SUM OF SAID SUCCESSIVE WORD LINES AND SAID WORD LINE DRIVE CIRCUIT | 41 |
| | 2 OR MORE WORD LINES, INTERMITTENTLY DEFECTIVE | SAID WORD LINE DRIVE CIRCUIT | 42 |
| | 2 OR MORE DEFECTIVE WORD LINES WITH COMMON DRIVE CIRCUIT | WORD LINE DRIVE CIRCUIT JOINTLY OWNED | 43 |
| | LARGE EXTENT DEFECTIVE BITS PARALLEL TO WORD LINE | WORD LINE INCLUDING SAID DEFECTIVE CELL | 44 |
| DIGIT LINE (MAY BE CALLED AS BIT LINE) | SINGLE DIGIT LINE IS DEFECTIVE | A SUM OF SAID DIGIT LINE AND SAID DIGIT LINE DRIVE CIRCUIT | 30 |
| | 2 OR MORE DIGIT LINES, SUCCESSIVELY DEFECTIVE | A SUM OF SAID SUCCESSIVE DIGIT LINES AND SAID DIGIT LINE DRIVE CIRCUIT | 31 |

FIG. 8A

| | | | |
|---|---|---|---|
| DIGIT LINE (MAY BE CALLED AS BIT LINE) | 2 OR MORE DIGIT LINES, INTERMITTENTLY DEFECTIVE | SAID DIGIT LINE DRIVE CIRCUIT | 32 |
| | 2 OR MORE DEFECTIVE DIGIT LINES WITH COMMON DRIVE CIRCUIT | DIGIT LINE DRIVE CIRCUIT JOINTLY OWNED | 33 |
| | LARGE EXTENT DEFECTIVE BITS PARALLEL TO DIGIT LINE | DIGIT LINE INCLUDING SAID DEFECTIVE CELL | 34 |
| DEFECTIVE CROSS POINT (MAY BE CALLED AS DEFECTIVE CROSS) | A COMBINATION OF DEFECTIVE DIGIT LINE AND A DEFECTIVE WORD LINE | LIMIT TO A CROSSED AREA | 50 |
| DEFECTIVE MINIMUM BLOCK | WHOLE AREA INSIDE MINIMUM CELL BLOCK IS DEFECTIVE | CIRCUIT WHICH DRIVES A MINIMUM CELL BLOCK | 62 |
| | DEFECTIVE BITS IN LARGE EXTENT, BUT TOTAL STATE IS LESS DEFECTIVE THAN DEFECTIVE WHOLE AREA | CIRCUIT WHICH DRIVES A MINIMUM CELL BLOCK | 63 |
| DEFECTIVE 2 BITS (IN CASE ANALYSIS OF DEFECTIVE 2 BITS IS PERFORMED FROM UPPER LEFT TO LOWER RIGHT) | DEFECTIVE 2 BIT PAIR IN CLOSE POINT | SAID DEFECTIVE CELL PAIR | 20 |
| | DEFECTIVE 2 BIT PAIR INCLUDING A LOWER RIGHT CELL OF THE NOTICED DEFECTIVE CELL | SAID DEFECTIVE CELL PAIR | 20.01 |
| | DEFECTIVE 2 BIT PAIR INCLUDING A LOWER LEFT CELL OF THE NOTICED DEFECTIVE CELL | SAID DEFECTIVE CELL PAIR | 20.02 |
| | DEFECTIVE 2 BIT PAIR INCLUDING A RIGHT CELL OF THE NOTICED DEFECTIVE CELL | SAID DEFECTIVE CELL PAIR | 20.03 |
| | DEFECTIVE 2 BIT PAIR INCLUDING A RIGHT CELL OF THE NOTICED DEFECTIVE CELL | SAID DEFECTIVE CELL PAIR | 20.04 |
| | DEFECTIVE 2 BIT PAIR INCLUDING A LOWER CELL PLURAL-BITS-SPACED FROM THE NOTICED DEFECTIVE CELL | BETWEEN SAID DEFECTIVE CELL PAIR | 20.05 |
| | DEFECTIVE 2 BIT PAIR INCLUDING A LOWER CELL PLURAL-BITS-SPACED FROM THE NOTICED DEFECTIVE CELL | BETWEEN SAID DEFECTIVE CELL PAIR | 20.06 |

FIG. 8B

| | | |
|---|---|---|
| DEFECTIVE 2 BITS (IN CASE ANALYSIS OF DEFECTIVE 2 BITS IS PERFORMED FROM UPPER LEFT TO LOWER RIGHT) | DEFECTIVE 2 BIT PAIR WITH COMMON CIRCUIT OR WIRING | CIRCUIT, WIRING JOINTLY OWNED BY SAID PAIR | 21 |
| DEFECTIVE 1 BIT | SINGLE DEFECT OF 1 BIT | NOT SUBSTITUTED | 10 |
| OTHER DEFECTS (MAY BE CALLED AS ELSE DEFECTS) | OBLIQUE DEFECT WITH EQUAL ROW ADDRESS AND EQUAL COLUMN ADDRESS | CIRCUIT WHICH DRIVES A CELL BLOCK INCLUDING SAID DEFECTS | 70 |
| DEFECTIVE BIT GROUP | DEFECTIVE 3 OR MORE BITS INCLUDED IN A LATTICE OF THE LEVEL SAME AS THAT OF AN ALLOWABLE POSITIONAL ERROR OF ANALYSIS, PROCESSING AND OBSERVATION DEVICE | A LATTICE INCLUDING SAID DEFECTS | 65 |

FIG. 8C

SPECIFIC PART SEARCHING METHOD AND DEVICE FOR MEMORY LSI

BACKGROUND OF THE INVENTION

1. Field of the Invention

The present invention relates to a system and a method of analysis, processing, observation of LSI having a built-in memory unit.

2. Description of the Related Art

Minute observation of a defective part of LSI by means of a scanning electron microscope, observation of a LSI section after cutting the LSI by means of a focusing ion beam (FIB), and composition analysis of the LSI by using a method such as electron beam probe microanalysis (EPMA) have hitherto been performed to clarify causes of defects in wafer surfaces produced during production of the memory LSI.

For performing observation or composition analysis of a defective part of LSI, it is necessary to indicate a spot to be observed with coordinates calculated from an origin fixed in a wafer surface. As a judgment standard for designating a part as a defective part to be observed is the state of the part is divided into two types in a broad way. The first type is a part detected as abnormal in shape by using an optical visual inspection device, and the second type is a part found electrically defective in function by a tester.

Specifying a part as abnormal in shape by using an optical visual inspection device is conducted, for example, by using a wafer visual inspection device of KLA co. ltd., USA, that is, model KLA21 xx series. With this model, a part of abnormal shape is specified by selecting one corner of a LSI chip disposed nearly in the center of a wafer surface as an origin, shifting the wafer or a stage mounted with the wafer to calculate a distance from the origin to the part of the abnormal shape.

A part of inferior electrical function of LSI found by a tester is designated by using memory cells regularly arranged in memory LSI. Normally, designation of memory cells is performed by using a logical address which is coordinates on a circuit diagram different from the circuit diagram of a physical address which designates the relative disposition in the wafer surface and by designating the number of the data input/output terminal which is called I/O.

When a test result of a part of an inferior electrical function by a tester is specified with the logical address, it is considered necessary to convert the data from the logical address to the physical address in the wafer surface and further transform to real array coordinates for specifying the part of electrically inferior part, and after finishing this, it becomes possible for the first time to perform composition analysis or various kinds of observations.

Conversion from the logical address to the physical address is performed by using a scramble function. The scramble function is constituted by any one or a combination of logical operators which use the logical address or I/O number as input, such as NOT (or INV which means inversion), AND, OR, NAND, NOR, XOR, XNOR, BUFFER (this means no processing is applied to input), the combination being different depending on kinds of LSI to be combined. Since the physical address expresses relative position coordinates between cells, it is possible to clearly indicate real arrangement coordinates of the defective cell by multiplying the physical address by a cell dimension and adding a dimension of wiring to be inserted between cells, a dimension of a peripheral circuit and a distance from the coordinate origin of the real array on memory LSI to the origin of the physical address.

A bit map display is used as means to find defects distribution by expressing parts of inferior electrical function detected by a tester in a distribution chart prepared with reference to a wafer surface. In this display, the physical address corresponding to the defective cell in the memory is expressed as a point on the coordinates, the point being printed on a paper in one case or displayed on a screen of such as a work station in another.

In the above case, a part of an electrically inferior function is specified by such as the above tester, the logical address is converted to the physical address by using the scramble function to find a distance in the wafer surface measured from the known origin, and the wafer or a stage on which the wafer is mounted is shifted by a desired distance from the origin to perform analysis or various kinds of observation.

Of the prior technique described above, a technique for specifying a part of abnormal shape by using an optical visual inspection device instructs that the wafer or a stage on which the wafer is mounted is shifted by a desired distance from the origin to perform analysis or various kinds of observation. However, when the accuracy of a stage shifting mechanism or a distance measuring mechanism is poor compared with the position accuracy which is required for indicating a defective part, analysis or observation is performed on a part different from the real defective part, thereby missing the chance to precisely find the real cause of defects.

The above problem similarly occurs when analysis or observation of a defective part is performed after the defective part is designated by using a tester. As a result of an electrical test, a defective cell can be specified from the address of a defect and a distance of the defective cell from the origin can be calculated by reading a dimension of a memory LSI chip or a dimension of the cell from design information. However, correct analysis or various kinds of observation of the defective cell is impossible if the stage traveling accuracy is relatively low. For example, a cell dimension of 16 Mbit dynamic random access memory (hereinafter referred to as DRAM) LSI is less than 1 $\mu$m, while traveling accuracy of the present stage is about 1 $\mu$m. As the LSI grows larger being more highly integrated to such as 64 Mbit or 256 Mbit, the cell dimension becomes still smaller than the stage traveling accuracy.

When a value, which is obtained by integrating the number of memory LSI included between the origin and a defective cell on a memory LSI wafer, is multiplied by a dimension of memory LSI or by a cell dimension to calculate a distance, the error included in the dimension of the memory LSI or the cell becomes enlarged by the number of integration.

When a bit map display, in which a physical address corresponding to a defective cell in the memory is expressed as a point on the coordinates, is used, the bit map display calculates a position of a cell which corresponds to a defective address even when the cause of the defect is not in the cell but in the peripheral circuit which drives the cell. Therefore, there is a problem that it can not clarify through analysis, processing and observation of the LSI whether the cause of the defect is in the cell or in the peripheral circuit.

When the cause of a defect is in the peripheral circuit which drives a cell, it is necessary to make correction of the position and dimension from those of a defective cell to the peripheral circuit which drives the cell before performing analysis, processing and observation of the defective cell. This correction must be made after judging the state of the defect depending on the result of an electrical test. Further, since the position information of the peripheral circuit which is to be corrected is different for each kind of memory LSI, there occur problems such that it is difficult to perform the job well unless an engineer is well versed in circuit design information and layout design information, and further correction itself will take much time to go through.

SUMMARY OF THE INVENTION

The present invention was developed in view of the above problems of the prior art. A first object of the present invention is to provide a device and a method which can be used for searching a real defective cell in analysis or various kinds of observations of electrically defective cells of memory LSI, removing the influence of poor accuracy or numerical calculation errors of a stage shifting mechanism of the device.

A second object of the present invention is to provide a device and a method which can be used for analysis or various observations of causes of defects even when a cause of a defect of a defective address revealed in the memory LSI is not in the cell side but in the peripheral circuit side which drives the cell.

The method of searching a specific cell of memory LSI of the present invention is a method in which an electrical test is performed on memory LSI of array structure which includes a plurality of memory cells repeatedly arranged therein and analysis, processing or observation is performed for memory LSI with reference to a part of a physical address which corresponds to a logical address outputted as a result of the electrical test, wherein position coordinates are continuously observed with reference to the area including the end point of the array structure of said memory cell, the memory cells, a part between memory cells, the number of memory cells existing on the memory LSI is counted based on the change in brightness or luminosity, and a part where said calculated value and the value of said physical address coincide with each other is selected as the part of said logical address.

A method of searching a specific part of memory LSI according to another embodiment of the present invention is a method in which an electrical test is performed on memory LSI, the specific part is determined based on outputted results of the electrical test and analysis, processing or observation are performed for memory LSI, wherein a cause of a defect is presumed from a defective phenomenon detected according to a result of the electrical test of memory LSI and a part designated by the position and dimension of the defective circuit which corresponds to the presumed cause of the defect is decided as the specific part.

A specific part searching device for memory LSI according to the present invention is a device in which an electrical test is performed on memory LSI of array structure which includes a plurality of memory cells repeatedly arranged therein and analysis, processing or observation is performed for memory LSI with reference to a part of a physical address which corresponds to a logical address outputted as a result of the electrical test, the device further comprises:

means for moving said memory LSI;
a pattern recognizer for observing said memory LSI;
a counter for receiving the observation result of said pattern recognizer and counting the number of changes of brightness or luminosity;
a control computer for controlling said moving means to move memory LSI and determining a part, of which a counted value of said counter and a value indicated by said physical address coincide with each other, as the part of said logical address so that position coordinates are continuously observed by said pattern recognizer with reference to the area including the end of the array structure of said memory cell, the memory cells and a part between memory cells.

A specific part searching device for memory LSI according to another embodiment of the present invention is a device in which an electrical test is performed on memory LSI of array structure which includes a plurality of memory cells repeatedly arranged therein and analysis, processing or observation are performed for memory LSI with reference to a part of a physical address which corresponds to a logical address outputted as a result of the electrical test, the device further comprises:

means for moving said memory LSI;
a pattern recognizer for observing said memory LSI;
a counter for receiving the observation result of said pattern recognizer and counting the number of changes of brightness or luminosity;
a control computer having a data base storing the position and dimension of a defective circuit corresponding to a defective phenomenon revealed by the result of the electrical test of memory LSI, which, in case said defective phenomenon is not stored in said data base, controls said moving means to move memory LSI and determining a part, of which a counted value of said counter and a value indicated by said physical address coincide with each other, as the part of said logical address so that position coordinates are continuously observed by said pattern recognizer with reference to the area including the end of the array structure of said memory cell, the memory cells, a part between memory cells; and which, in case said defective phenomenon is stored in said data base, determines a part indicated by the position and dimension of the defective circuit stored corresponding to said data base as said specific part.

Among the methods or devices of the present invention structured as above, a method or a device which specifies the position by observing a memory cell array continuously and depending upon the change in the brightness or luminosity, the movement is detected for every movement of the memory cell and thus an error produced by each movement is eliminated each time it is detected.

With the device and the method in which a cause of a defect is presumed from a revealed defective phenomenon and a part designated by the position and dimension of a defective circuit which corresponds to the presumed cause of the defect is determined as the specific part, a part having an actual defect is specified as the specific part and hence analysis is performed accurately.

The above and other objects, features, and advantages of the present invention will become apparent from the following description based on the accompanying drawings which illustrate an example of a preferred embodiment of the present invention.

BRIEF DESCRIPTION OF THE DRAWINGS

FIG. 4(a) and FIG. 4(b) is a view showing an example of typical types of defects, and defects and ID numbers corresponding to those types.

FIG. 8(a) to FIG. 8(c) shows an example of typical types of defects, and corresponding items such as contents of defects or positions or dimensions to be substituted, and ID numbers.

DETAILED DESCRIPTION OF THE PREFERRED EMBODIMENTS

A first embodiment of the present invention will next be described with reference to the drawings.

Figure 1:
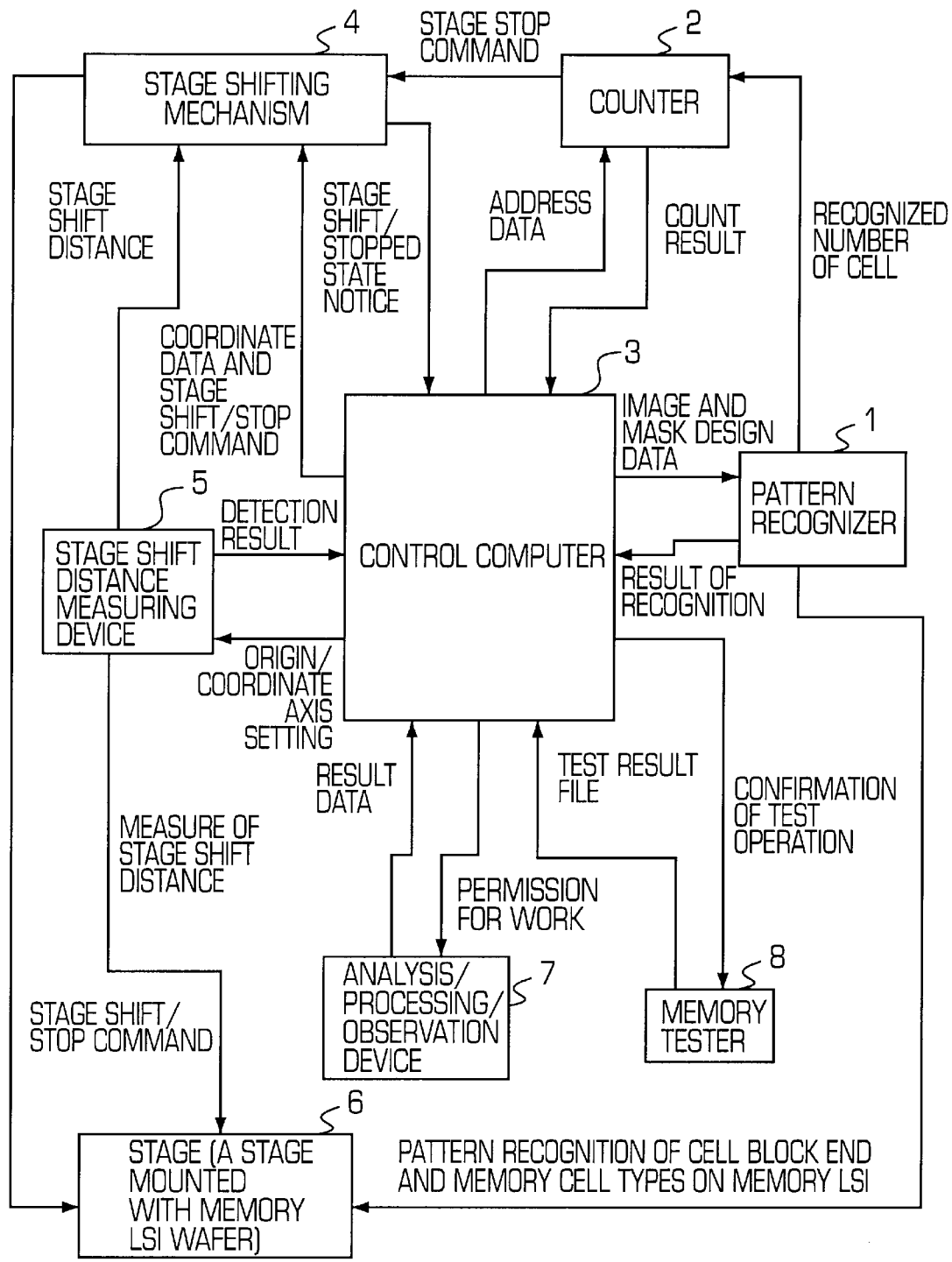
FIG. 1 is a block chart showing a structure of an embodiment of the present invention.
Figure 2:
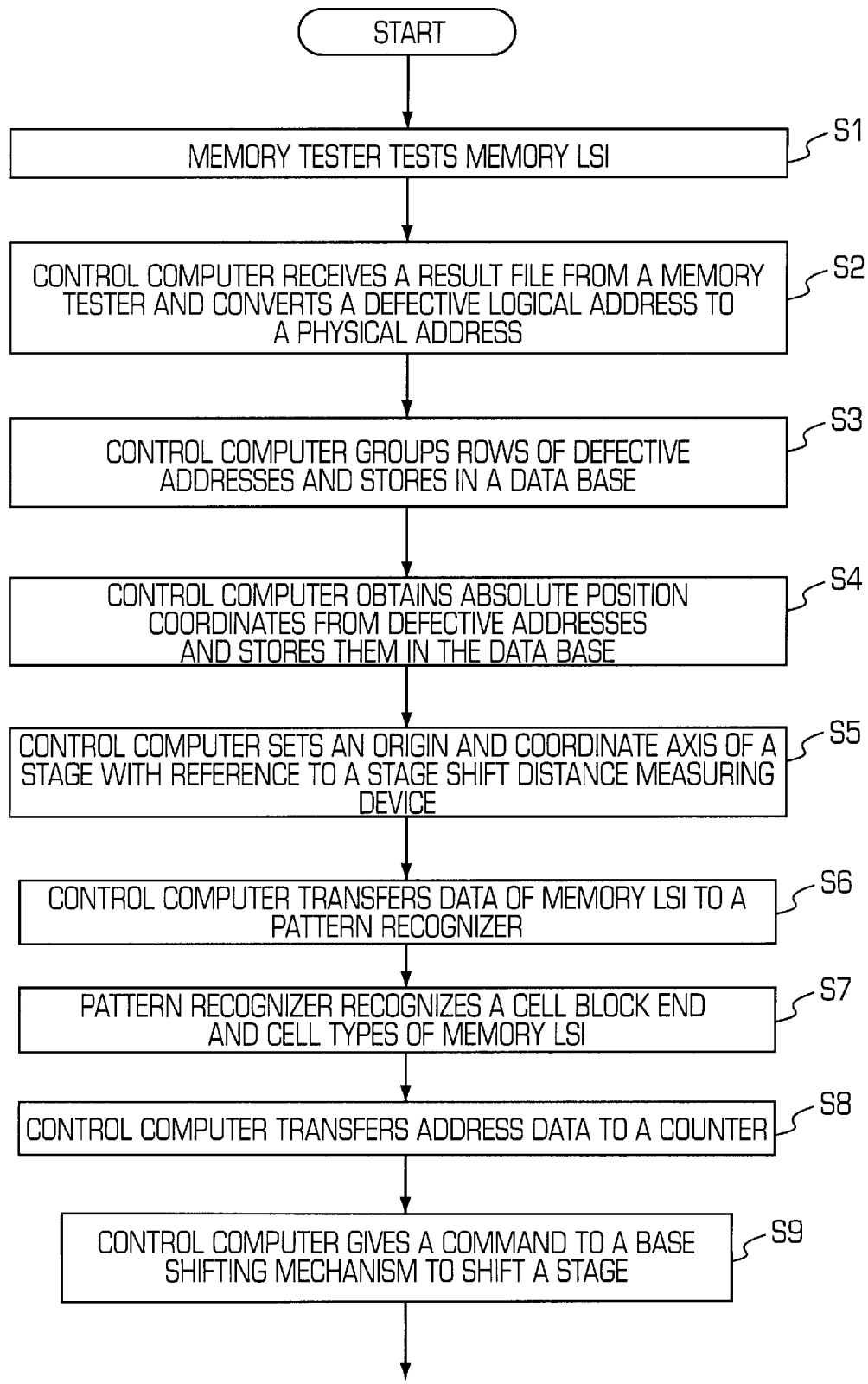
FIG. 2 is a flow chart showing operation of the embodiment of the present invention.
Figure 3:
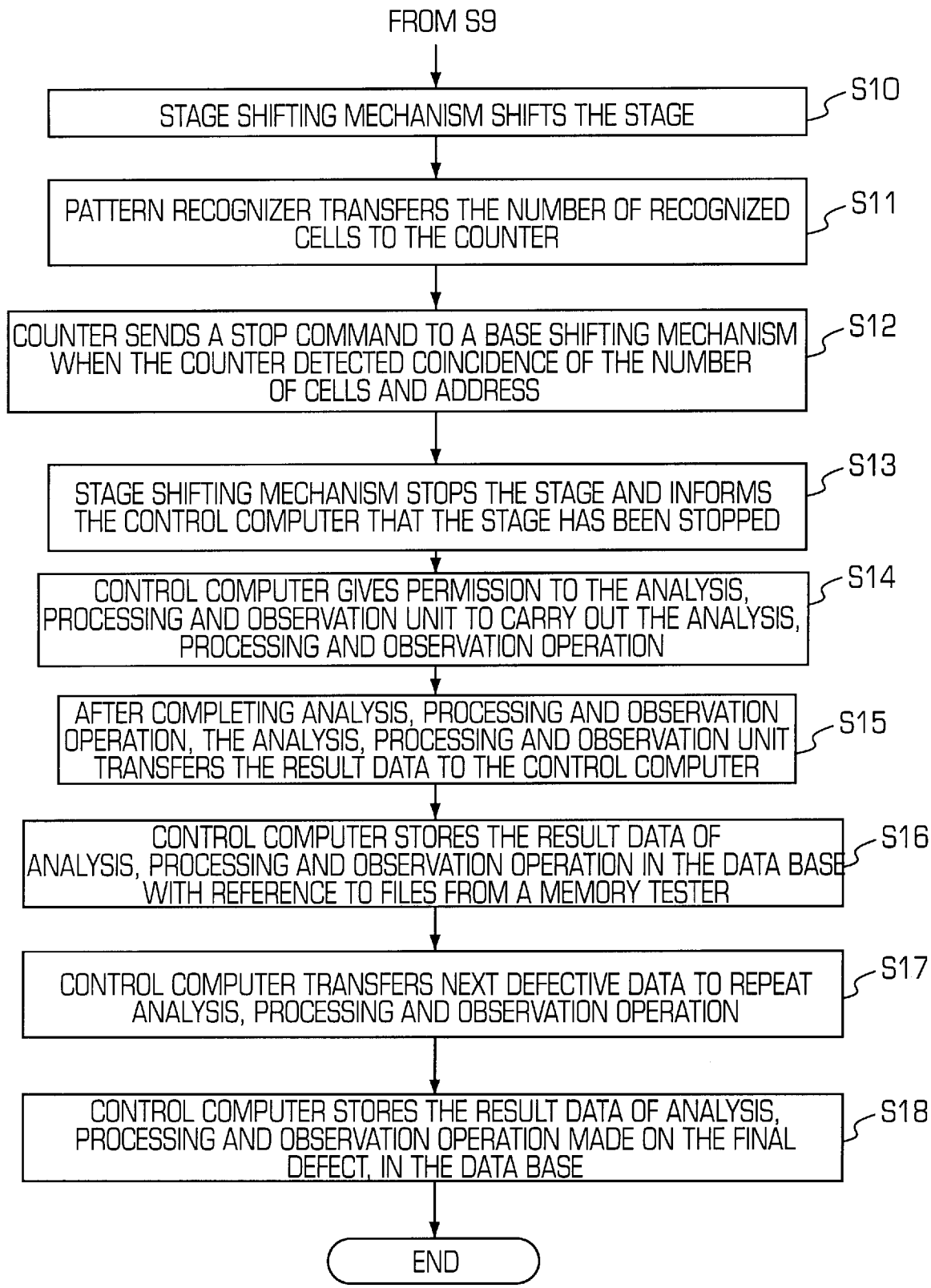
FIG. 3 is a flow chart showing operation of the embodiment of the present invention.

FIG. 1 is a view showing a structure of a first embodiment of the present invention, FIG. 2 and FIG. 3 are flow charts each showing operation of the first embodiment of the present invention.

The present embodiment is structured to remove the influence of insufficient accuracy or numerical calculation errors of a stage shifting mechanism which may be produced in analysis, processing and observation operation, by searching a region in memory LSI which includes a group of cells (hereinafter referred to as a cell block) from end to end with absolute position coordinates and thereafter further searching the cell block by counting the number of cells in the cell block.

The present embodiment comprises pattern recognizer 1, counter 2, stage shifting mechanism 4, stage shift distance measuring device 5, observation unit 7, memory tester 8, and stage 6 which constitutes the moving means together with stage shifting mechanism 4, a shift distance of stage 6 being controlled by control computer 3 which controls each component and stage shifting mechanism 4.

When operation is started, an electrical function test of memory LSI is first performed by memory tester 8 in accordance with the fixed procedure and a result file is prepared being described with the logical address which shows the result of the test (step S1).

Control computer 3 converts the result file written by the logical address and prepared in step S1 into the physical address by using a scramble function (step S2). Then, control computer 3 reduces the number of defective data by grouping rows of defective addresses according to the defect type with reference to the data converted to the physical address in step S2, and prepares a data base in which each group is attached with class ID which represents a feature of each group (step S3). As shown in FIG. 4, grouping of defective types is to classify defects arrangements of product wafers experimentally into several types. Subsequently, control computer 3 calculates absolute position coordinates of the defect by multiplying the physical address by the cell dimension and adding a dimension of wiring to be inserted between cells and a dimension of a peripheral circuit as well as a distance from the origin of absolute position coordinates to the origin of the physical address on memory LSI (step S4).

Next, position data of origins on the wafer and memory LSI chip are transferred fromcontrol computer 3 to stage shift distance measuring device 5 to set the origins and coordinate axis (step S5). After finishing through this step S5, absolute position coordinates calculated in step S4 are transferred to analysis, processing and observation unit 7 of various kinds, and then, it becomes possible to indicate a point on the wafer with common absolute position coordinates by designating the logical address of memory tester 8.

Next, data sent from control computer 3 to pattern recognizer 1 is compared with data obtained in pattern recognizer 1, and through this procedure, images of a cell block end and a cell shape as well as mask design data which are fixed according to kinds of memory LSI to be handled are transferred to pattern recognizer 1 (step S6). Successively, images of the cell block end and the cell shape obtained by pattern recognizer 1 are compared with each other (step S7). A necessary moving distance is obtained corresponding to the number of cells from the shape of the cell block end and the cell depending on the change in brightness or luminosity which occurs corresponding to position coordinates of the image.

Following which, the physical address of the defective cell is transferred to the counter (step S8) and the absolute position coordinates of the defect are sent to stage shifting mechanism 4 on which the wafers mounted (step S9). Receiving this notice, stage 6 moves toward the absolute position coordinates of the defect (step S10). The number of cells recognized by pattern recognizer 1 is counted one after another by counter 2 (step S11), and the movement of stage 6 is stopped when the count value of counter 2 coincides with the number of cells obtained in step S7.

A series of operation of the above steps S8 to S11 is performed as follows. Control computer 3 transfers the address of the defective cell to cQunter 2, and simultaneously sends the absolute position coordinates of the defect to stage shifting mechanism 4 to instruct transfer of stage 6. Upon receiving the instruction, stage shifting mechanism 4 transfers stage 6 to the absolute position coordinates of the defective cell. On the other hand, pattern recognizer 1 transfers the number of recognized cells one by one to counter 2. Counter 2 compares the number of cells recognized by pattern recognizer 1 with the address received from control computer 3 and sends a stop command to stage shifting mechanism 4 when both values coincide with each other (step S12).

Then, stage shifting mechanism 4 stops stage 6 and informs control computer 3 of the stop of stage 6 (step S13). Receiving the notice, control computer 3 recognizes the completion of shifting to the defective position, and allows analysis, processing and observation unit 7 to perform the analysis, processing and observation work (step 14). Accordingly, various kinds of analysis, processing and observation work are carried out at the shifted position.

Next, results of the various kinds of analysis, processing and observation work carried out at the desired position instep S14 are transferred to control computer 3 (step S15) and stored in the data base being attached with related file ID of memory tester 8 (step S16).

Each step S15 and S16 is realized when analysis, processing and observation unit 7 has finished analysis, processing and observation work at the desired position and has successively transferred resulted data to control computer 3. Control computer 3 stores the resulted data in its own data base after annexing file ID related with the file from memory tester 8 to the data.

A series of operation described in above steps S1 to S16 is performed repeatedly, and control computer 3 instructs to repeat analysis, processing and observation operation of a next defect (step S17).

When results of analysis, processing and observation operation carried out on the last defect are stored in the data base of control computer 3, the operation is completed step S18).

Figure 5:
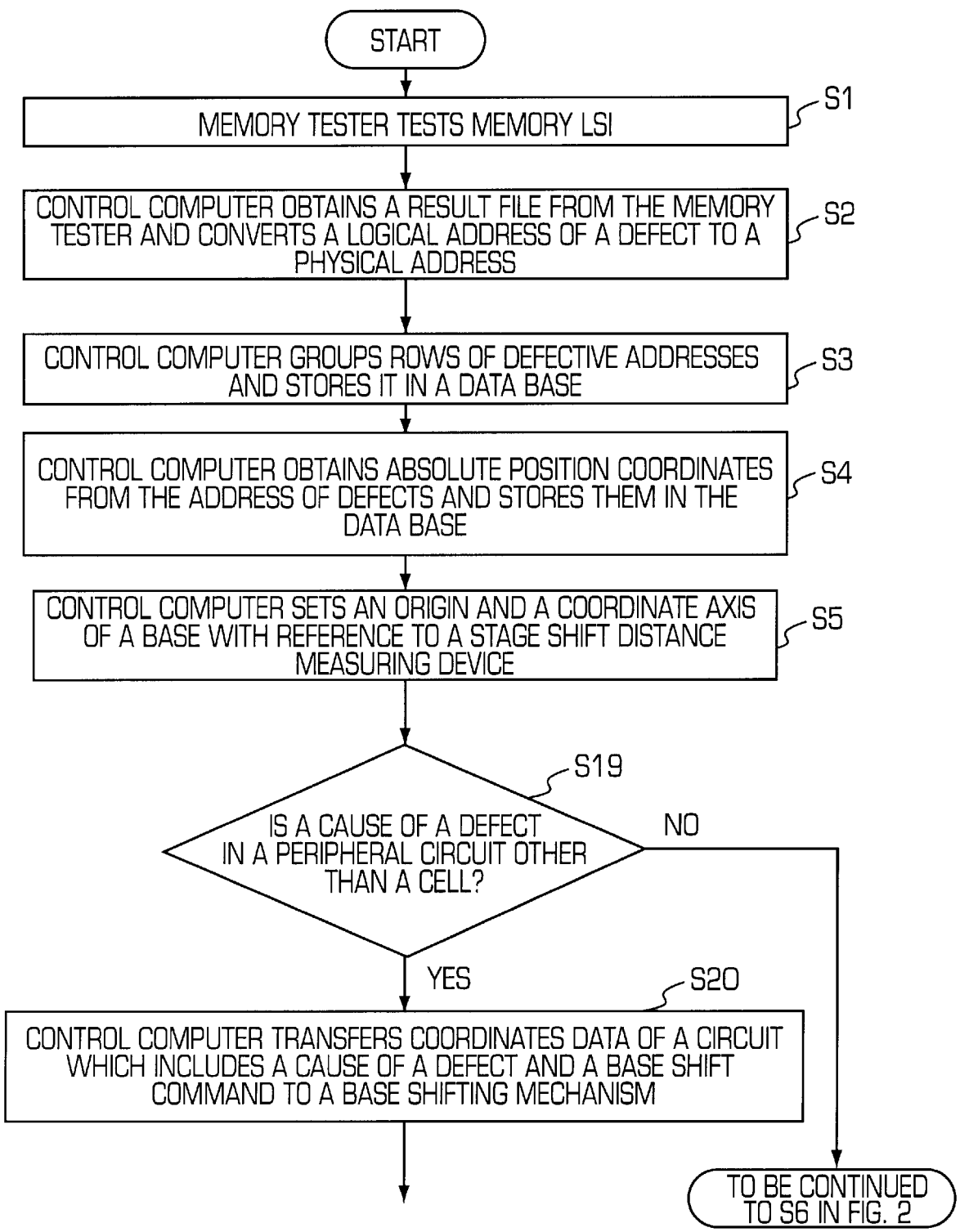
FIG. 5 is a flow chart showing operation of the embodiment of the present invention.
Figure 6:
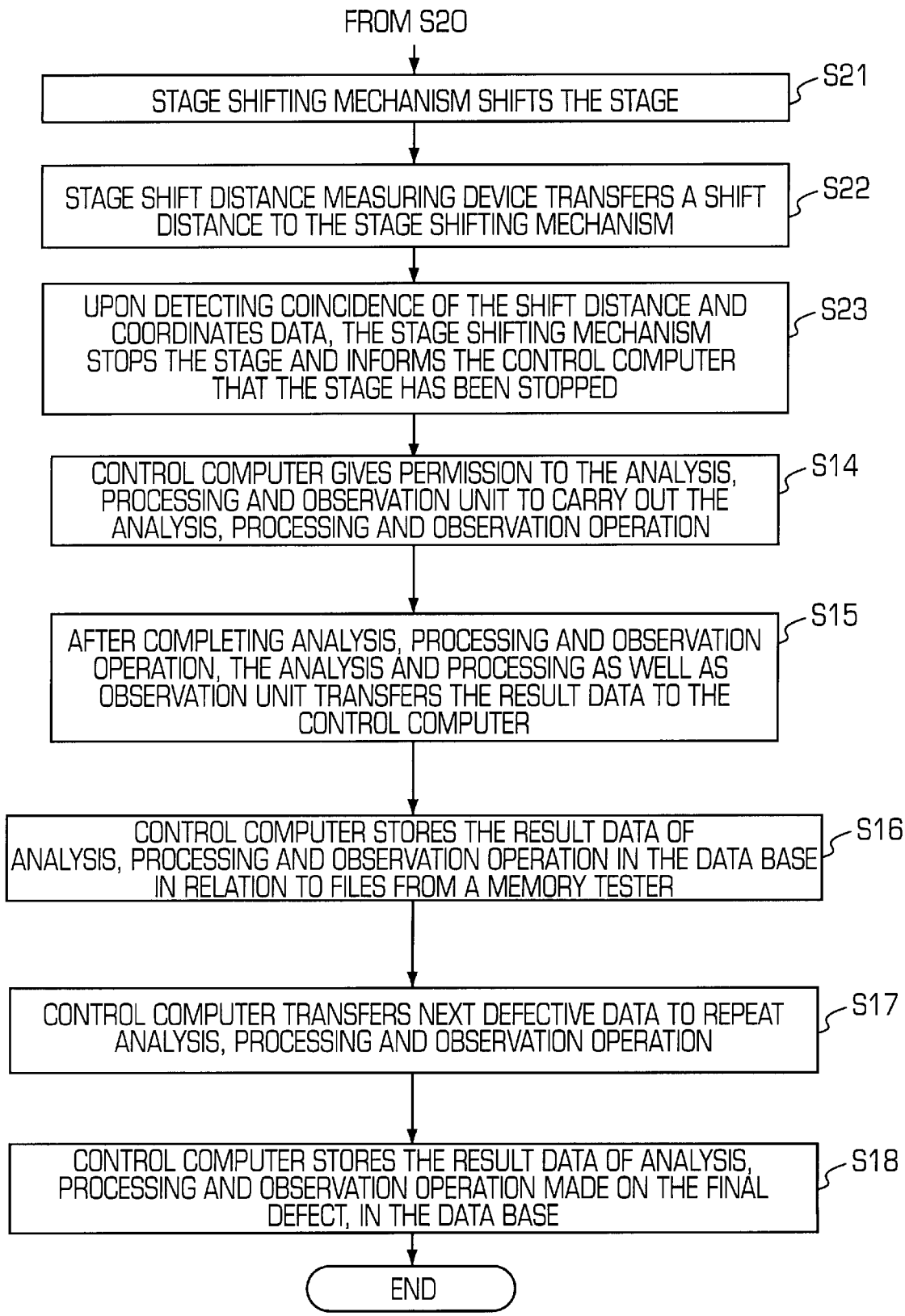
FIG. 6 is a flow chart showing operation of the embodiment of the present invention.

A second embodiment of the present invention will next be described. The structure of this embodiment is the same as that of the first embodiment shown in FIG. 1, but only its operation is different. FIG. 5 and FIG. 6 are flow charts each showing the operation of the present embodiment.

The present embodiment is structured such that, when a cause of a defect is not in the cell side but in the peripheral circuit side which drives the cell, analysis, processing as well as observation of the cause of the defect in the peripheral circuit can be performed, by making correction of the position and dimension by shifting them from the defective cell side to the peripheral circuit side which drives the defective cell before performing analysis, processing and observation operation.

Among the operations shown in the flow charts of FIG. 5 and FIG. 6, step 1 to step 5 are similar to those of the first embodiment shown in FIG. 2. In step S19 to be performed after step S5, it is confirmed whether the cause of defects is in the peripheral circuit or not, and if it is confirmed that the cause of defects is not in the peripheral circuit, the operation to be performed thereafter are the same as operation in step S6 and in the following steps shown in FIG. 2 and FIG. 3.

Through the operation from step S1 to S5, the origin and coordinate axis of stage 6 are set to stage shift distance measuring device 5. If it is confirmed in above step S19 that the cause of the defect is not in the cell side but in the peripheral circuit side which drives the cell, the operation moves to step S20.

In step S20, correction is made to replace the position and dimension of the cell corresponding to a defective address by the position and dimension of the peripheral circuit which drives the cell of the defective address, and then the coordinate data of said peripheral circuit is transferred to stage shifting mechanism 4.

Next, computer 3 transfers the corrected data to stage shifting mechanism 4, and stage shifting mechanism 4 moves stage 6 to the position coordinates of the peripheral circuit. Stage 6 mounted with a wafer is thus shifted according to the data transferred in step S20 (step S21).

Subsequently, a shift distance of stage 6 is measured (step S22), a desired shift distance and an actual shift distance are compared, and stage 6 is stopped when both shift distances coincide with each other. This stop of stage 6 is again notified to control computer 3 (step S23).

A series of operations of above steps S22, S23 is performed as follows.

Stage shift distance measuring device 5 measures a shift distance of stage 6 and transfers the measured shift distance to stage shifting mechanism 4. Stage shift mechanism 4 compares position coordinates received from stage shift distance measuring device 5 with position coordinates received from control computer 3, and when both coordinates coincide with each other, stage shifting mechanism 4 stops stage 6 and notify control computer 3 that stage 6 has been stopped.

Thereafter, in the same way as the first embodiment, the step joins to step S14 in which control computer 3 allows analysis, processing and observation unit 7 to carry out analysis, processing and observation operation.

EMBODIMENT 1

A concrete example to realize the above first embodiment will be described below with reference to FIG. 1 to FIG. 3.

A memory tester on the market will meet the demand of memory tester 8 and there is no restriction on kinds of machines and functions thereof. Memory tester 8 tests memory LSI in accordance with a test program, and writes an address list of output values which differ from the expected values and the electric current carried at the time of test together with file ID into a result file. Further, it is allowable to write, in addition to the above data, history ID into said result file, the history describing how the output value different from the expected value was produced. This operation corresponds to step S1.

Control computer 3 is an engineering work station or a personal computer which has a storage medium containing a data base and a communication circuit, and controls the whole device of the present embodiment. Said data base includes the following data and conversion method as the data and conversion method which are necessary to perform data conversion by the kinds of memory LSI.

Control computer 3 observes memory tester 8 and obtains said result file when it detects the completion of said result file, prepares a scramble function for the kind of said memory LSI in accordance with the kind ID entered in said file and converts the defective logical address to the physical address by using said scramble function. This operation corresponds to step 2.

Next, control computer 3 groups rows of defective addresses one after another by the defect type and the test history shown in FIG. 4(a) and FIG. 4(b), annexes to each group a class ID which expresses a characteristic of the group and further annexes thereto said result file ID or file ID which is associable from said result file and stores them in the data base of his own. This operation corresponds to step S3.

Figure 7:
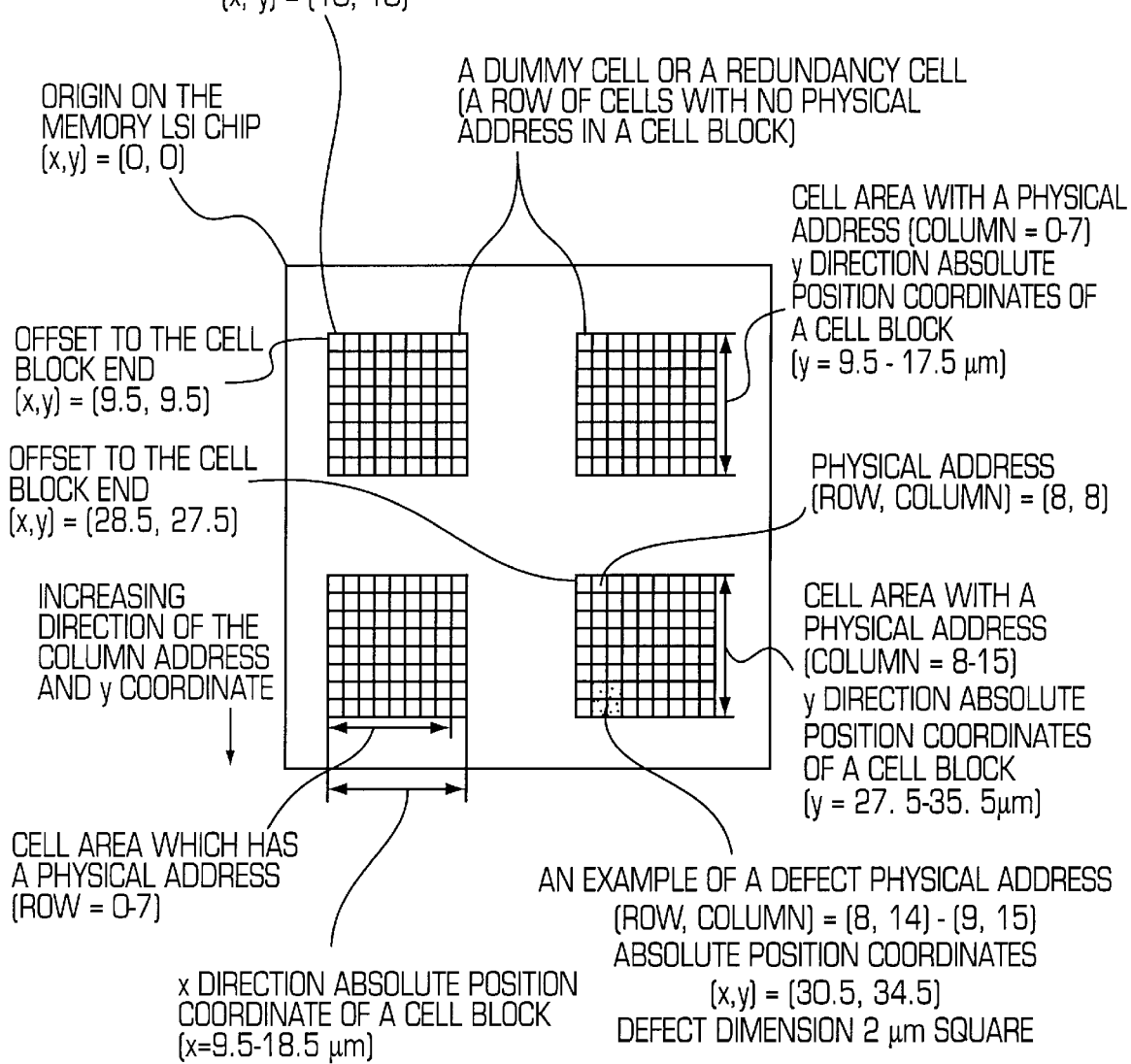
FIG. 7 is a drawing showing examples of conversion from the physical address to absolute position coordinates.

Control computer 3 calculates, as shown in FIG. 7, absolute position coordinates on the defective memory LSI chip by multiplying the physical address by the cell dimension, by adding a dimension of wiring to be inserted between cells and further adding a dimension of a peripheral circuit as well as a distance from the origin of absolute position coordinates to the origin of the physical address on memory LSI, and stores thus obtained calculation in the data base of his own after annexing to the calculation said result file ID or file ID associable from said result file. This operation corresponds to step S4.

Control computer 3 settles, with reference to stage shift distance measuring device 5, features of a wafer inherent in the wafer itself and expresses the orientation of the wafer represented by such as an orientation flat (hereinafter referred to as OF) or a notch, a dimension of the wafer, the origin and the chip coordinate axis on the wafer, a dimension of a memory LSI chip, and the origin and the position coordinate axis on the chip. This operation corresponds to step S5.

Control computer 3 transfers images of a block end and a cell shape which are obtained corresponding to the kind of objective memory LSI and mask design data to pattern recognizer 1. This step corresponds to step S6.

Pattern recognizer 1 uses a solid state image sensing optical device and measures the change produced in a brightness signal or a luminosity signal corresponding to the distance from the cell block end. Pattern recognizer 1 compares similarity of changes in brightness or changes in luminosity with reference to position coordinates between these data and images of the cell block end or the cell or the mask design data. Then, by making comparison between a group of detected dimensions of a plurality of cells as well as dispersion in dimensions and a group of cell dimensions in the mask, design data, pattern recognizer 1 removes abnormal data which may be produced in case there is foreign substances on the cell or pattern collapse has occurred, and replaces the abnormal data by the number of cells which corresponds to the abnormal data. Further, by referring to the mask design data to know positions and numbers of cells to be used as a dummy or for substitution, it becomes possible to remove the dummy cells and substitution cells from the number of cells and recognize the shape of the cell block end and cell clearly.

Pattern recognizer 1 compares an image of a vicinity of the cell block end or a cell region which it obtained through its own operation with an image obtained from control computer 3, with reference to the change in the brightness or in the luminosity, the change being generated corresponding to position coordinates of each image, consequently recognizing the shape of the cell block end and the cell. This operation corresponds to step S7.

Control computer 3 transfers the address of the defective cell to counter 2. This operation corresponds to step S8.

Counter 2 has a function for performing addition, subtraction and clearing operation with reference to the number of cells recognized by pattern recognizer 1 and a communication circuit. By adding or subtracting the cell recognition frequency of pattern recognizer 1, counter 2 calculates the recognition frequency which coincides with the defective address, and thus counter 2 can search the objective defective cell.

Control computer 3 gives a stage shift command to stage shifting mechanism 4. This operation corresponds to step S9.

Stage shifting mechanism 4 transfers stage 6 to the absolute position coordinates of said defective cell. This operation corresponds to step S10.

Pattern recognizer 1 compares changes in the brightness or in the luminosity generated corresponding to position coordinates of images with reference to the image of a vicinity of the cell block end or the cell region which it obtained through its own operation and the image which it obtained from control computer 3, thereby recognizing the shape of the cell block end and the cell. Pattern recognizer 1 further compares dimensions as well as dispersion in the dimensions of a plurality of cells with dimensions of cells in the design data to remove abnormal values (a value which is n times or 1/n of a mean value of cell dimensions, where n is an integer) which may occur in case when there is foreign substances on the cell or pattern collapse has occurred, and replace the abnormal values by the number of cells which corresponds to the abnormal values.

Pattern recognizer 1 further refers to the mask design data to find the position and the number of dummy cells and redundancy cells for substitution neither of which are included in effective cells. By removing the number of the dummy cells and the redundancy cells from the number of the recognized cells, pattern recognizer 1 can prevent errors which may be caused in counting the address. Pattern recognizer 1 sends the number of said recognized cells to counter 2. This operation corresponds to step S11.

Counter 2 compares the number of the recognized cells received from pattern recognizer 1 with the address obtained from control computer 3, and sends a stop command to stage shifting mechanism 4 when the above data coincide with each other. This operation corresponds to step S12.

Stage shifting mechanism 4,stops stage 6 and informs control computer 3 that stage 6 has been stopped. This operation corresponds to step S13.

As described above, various observation, analysis and processing operation can be carried out with reference to the desired part.

Further, pattern recognizer 1 of the present embodiment may be constructed such that it performs pattern recognition activity by using an electron microscope or a laser microscope in place of a solid state image sensing optical device and utilizing the change of intensity of electron beam or laser beam which is generated corresponding to the distance from the cell block end. In other words, analysis, processing and observation unit 7 may be used as pattern recognizer 1.

EMBODIMENT 2

A concrete example for realizing a second embodiment will be described below with reference to FIG. 1, FIG. 5, and FIG. 6.

Control computer 3 analyzes whether a cause of the defect of the defective phenomenon shown in the test result of memory tester 8 is in the cell side or in the peripheral circuit side which drives the cell, according to a classification result of the type of the electric current or the defective address. This analysis is performed in accordance with the contents of the classification as shown in FIG. 8(a) to FIG. 8(c), and when a cause of the defect is in the peripheral circuit side which drives the cell, the position and dimension are corrected to those of the peripheral circuit. This kind of technique has been developed and established through accumulation of technical knowledge obtained in the production process of DRAM. This operation corresponds to step S19.

Control computer 3 transfers coordinates data of said peripheral circuit to stage shifting mechanism 4 when a cause of the defect is in the peripheral circuit side which drives the cell. This operation corresponds to step S20.

Stage shifting mechanism 4 has a communication function and a driving unit to transfers stage 6.

Stage shifting mechanism 4 transfers stage 6 to position coordinates of said peripheral circuit. This operation corresponds to step S21.

Stage shifting mechanism 4 compares said position coordinates and position coordinates received from stage shift distance measuring device 5, and stops stage 6 when both data coincide and informs control computer 3 that stage 6 has been stopped. This operation corresponds to step S22.

Stage shift distance measuring device 5 has a communication function and a measuring device for measuring a shift distance of stage 6. Now, stage 6 is moved by stage shifting device 4. Stage 6 has coupled stages, one is a rough-movement stage which is roughly moved and the other is a micro-movement stage which is moved in a very small range. Stage 6 may further be coupled with a mirror, a lens or a tube which guides electromagnetic waves or charged particles which are produced by a device that performs pattern recognition, or by a device that performs analysis, processing and observation operation.

Control computer 3 gives permission to analysis, processing and observation unit 7 to carry out analysis, processing and observation operation. This operation corresponds to step S14.

Analysis, processing and observation unit 7 is a device comprising a communication function and a function for analysis, processing and observation using one or an optional combination of devices which use electromagnetic waves (a laser which is an electromagnetic wave comprising visible rays, infrared rays, ultraviolet rays, X rays, radio waves and phase) or charged particles (electron, ion, plasma).

Analysis, processing and observation unit 7 performs analysis, processing and observation operation at said coordinates and after completing the operation, it transfers resulted data to control computer 3. This operation corresponds to step S15.

Control computer 3, when receives the result data, stores the result data in its own data base annexing file ID which is associable from the result file to be obtainable from memory tester 8. This operation corresponds to step S16.

Control computer 3 repeats analysis, processing and observation operation on a next defect when analysis operation on one defect is finished. This operation corresponds to step S17.

Upon completion of operation storing the analysis, processing and observation results made on the last defect into the database of control computer 3, the work is finished. This operation corresponds to step S18.

As described above, various kinds of observation, analysis and processing operation can be performed with reference to the desired part.

Since the present invention is structured as described above, it has effects described in the following.

With the system and device of the present invention, it is possible to obtain excellent positioning accuracy without being largely affected by poor traveling accuracy of moving means, and hence the present invention has an effect that it enables to perform analysis, processing and observation operation based on positioning of high precision in a reduced time.

Since a part which actually has a defect is specified, it becomes possible to avoid analysis, processing and observation operation at the incorrect position, thus allowing to perform the analysis, processing and observation operation of a really defective part rapidly and also it becomes easy to grasp the correct state of distribution of the cause of defects.

It is to be understood, however, that although the characteristics and advantages of the present invention have been set forth in the foregoing description, the disclosure is illustrative only, and changes may be made in the arrangement of the parts with in the scope of the appended claims.

What is claimed is:

1. A method of searching a specific cell of memory LSI, said method being employed in performing analysis, processing and observation operation with reference to a part of a physical address which corresponds to a logical address outputted as a result of an electrical test performed on memory LSI of array structure in which a plurality of memory cells are repeatedly arranged, wherein position coordinates are continuously observed with reference to an area including the end point of the array structure of said memory cell, the memory cells and a part between the memory cells; the number of memory cells on memory cell LSI is counted according to changes in brightness or luminosity; and a part in which said counted value and the value shown by said physical address coincide with each other is selected as the part of said logical address.

2. A device for searching a specific cell of memory LSI, said device being employed in performing analysis, processing and observation operation with reference to a part of a physical address which corresponds to a logical address outputted as a result of an electrical test performed on memory LSI of array structure in which a plurality of memory cells are repeatedly arranged, said device comprising:

moving means for moving said memory LSI;

a pattern recognizer for observing said memory LSI;

a counter for receiving an observation result of said pattern recognizer and counting the number of changes in brightness or luminosity detected in the result data;

a control computer for moving memory LSI by means of said moving means so that coordinates are continuously observed by said pattern recognizer with reference to an area including the end of the array structure of said memory cell, the memory cells, a part between the memory cells, and for determining the part of said logical address by selecting a part in which a counted value of said counter and a value indicated by said physical address coincide with each other.

3. A method of identifying a specific part of a LSI memory for analysis, said method comprising;

performing a test on said memory to provide a memory test result;

determining, from said memory test result, that a defect exists;

classifying each said defect to provide a classification result;

identifying a part of said memory related to said defect;

making a judgment as to whether said defect related to said part of said memory is caused by a fault with a memory cell at said part of said memory or by a fault with a peripheral circuit for driving said memory cell;

when said judgment indicates said fault with said memory cell, identifying said memory cell as said specific part for analysis; and when said judgment indicates said fault with said peripheral circuit, identifying said peripheral circuit as said specific part for analysis;

wherein said judgment is based on a location of said defect and on said classification result.

4. A device for searching a specific part of memory LSI, said device being employed in performing analysis, processing and observation operation with reference to a part of a physical address which corresponds to a logical address outputted as a result of an electrical test performed on memory LSI of array structure in which a plurality of memory cells are repeatedly arranged, said device comprising:

moving means for moving said memory LSI;

a pattern recognizer for observing said memory LSI;

a counter for receiving an observation result of said pattern recognizer and counting the number of changes in brightness or luminosity detected in the result data;

a control computer having a data base storing the position and dimension of a defective circuit corresponding to a defective phenomenon revealed by the result of the electrical test of memory LSI, which, in case the defective phenomenon is not stored in the data base, controls said moving means to move memory LSI so that position coordinates are continuously observed by said pattern recognizer with reference to an area including the end of the array structure of said memory cell, the memory cells, a part between the memory cells, and determining the part of said logical address by detecting a part in which a counted value of said counter and a value indicated by said physical address coincide with each other; and which, in case said defective phenomenon is stored in said data base, determines a part indicated by the position and dimension of the defective circuit stored corresponding to said data base as said specific part.

\* \* \* \* \*